(12) United States Patent
Yeh et al.

(10) Patent No.: US 11,881,347 B2
(45) Date of Patent: Jan. 23, 2024

(54) MICRO TACTILITY-SIMULATING SENSING DEVICE AND METHOD FOR PRODUCING THE DEVICE

(71) Applicant: National Tsing Hua University, Hsinchu (TW)

(72) Inventors: Sheng-Kai Yeh, Hsinchu (TW); Jiunn-Horng Lee, Hsinchu (TW); Weileun Fang, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 966 days.

(21) Appl. No.: 16/700,210

(22) Filed: Dec. 2, 2019

(65) Prior Publication Data
US 2021/0074469 A1    Mar. 11, 2021

(30) Foreign Application Priority Data
Sep. 9, 2019  (TW) .................................. 108132482

(51) Int. Cl.
*H01F 27/29* (2006.01)
*H01F 3/14* (2006.01)
(Continued)

(52) U.S. Cl.
CPC ............. *H01F 27/292* (2013.01); *H01F 3/14* (2013.01); *H01F 17/0013* (2013.01);
(Continued)

(58) Field of Classification Search
CPC . H03K 2017/9706; H01F 27/292; H01F 3/14; H01F 17/0013; H01F 17/04; H01F 41/046
See application file for complete search history.

(56) References Cited

U.S. PATENT DOCUMENTS 10,428,562 B2 * 10/2019 Guibbert ................. E05B 81/04
11,263,421 B2 *  3/2022 Liu ....................... H03K 17/962
(Continued)

OTHER PUBLICATIONS

Yeh, Sheng-Kai, et al., paper entitled "On the detection interfaces for inductive type tactile sensors", Sensors and Actuators A 297 (2019) 11545, 15 pages.
(Continued)

*Primary Examiner* — Bernard Rojas
(74) *Attorney, Agent, or Firm* — Bever, Hoffman & Harms, LLP

(57) ABSTRACT

The present invention provides a micro tactility-simulating sensing device, including: a chip including a first top surface and a first inductor, wherein the first top surface has wiring through holes configured to allow an external circuit to connect to the first inductor, and the first top surface is a flat surface except the wiring through holes; a magnetic rigid body coupled with the first inductor to allow the first inductor to sense a magnetic flux passing therethrough, and configured to receive a tactile load; and a polymer configured between the chip and the magnetic rigid body to have a characteristic distance therebetween, wherein the characteristic distance and the magnetic flux have a functional relationship. The micro tactility-simulating sensing device of the present invention can effectively increase the magnitude of the measured signal and provide two different ways to read the signal.

22 Claims, 4 Drawing Sheets

(51) Int. Cl.
- *H01F 41/04* (2006.01)
- *H01F 17/04* (2006.01)
- *H01F 17/00* (2006.01)
- *H01H 51/22* (2006.01)

(52) U.S. Cl.
CPC ........... *H01F 17/04* (2013.01); *H01F 41/046* (2013.01); *H01H 51/22* (2013.01); *H01H 2215/00* (2013.01); *H03K 2217/96062* (2013.01)

(56) References Cited

U.S. PATENT DOCUMENTS

| | | | | |
|---|---|---|---|---|
| 2011/0187204 A1* | 8/2011 | Lacey | ................... | H03K 17/96 307/139 |
| 2018/0128650 A1* | 5/2018 | Bruwer | ................ | G01D 5/2006 |

OTHER PUBLICATIONS

Yeh, Sheng-Kai, et al., paper entitled "Integration of Stainless-Steel Tactile Bump With Inductive Tactile Sensor Array For 3D Micro Joystick Button Application", 2019 IEEE, Eurosensors XXXIII, Berlin, Germany, Jun. 23-27, 2019, 4 pages.

Yeh, Sheng-Kai et al., paper entitled "Inductive Micro Tri-Axial Tactile Sensor Using a CMOS Chip With a Coil Array", IEEE Electron Device Letters, vol. 40, No. 4, Apr. 2019, 4 pages.

* cited by examiner

MICRO TACTILITY-SIMULATING SENSING DEVICE AND METHOD FOR PRODUCING THE DEVICE

CROSS-REFERENCE TO RELATED APPLICATION AND CLAIM OF PRIORITY

The application claims the benefit of Taiwan Patent Application No. 108132482, filed on Sep. 9, 2019, at the Taiwan Intellectual Property Office, the disclosures of which are incorporated herein in their entirety by reference.

FIELD OF THE INVENTION

The invention is related to a tactility-simulating sensing device and the method for producing the device, and more particularly to a micro tactility-simulating sensing device and the method for producing the device.

BACKGROUND OF THE INVENTION

In prior art, the micro tactility-simulating sensing devices are mostly produced using the microelectromechanical system (MEMS) technology, where suspended thin film structures are used for sensing. However, the sensing structures could be damaged under a larger load. Moreover, in the last stage of the suspended thin film production, the sacrificial layer has to be removed. However, due to the Van der Waals force, the stiction problem may appear, where the stiction is the adhesion of the otherwise suspended thin film to the substrate. The result is a low yield of the final product. The suspended thin film produced by the MEMS technology also has the residual stress problem, which may cause the drift of initial value of the signal, the property change of the device, and the reduction of the structure integrity and lifetime of the device. Furthermore, there are other production problems like the influence of etching on the device, the drift of signal and the yield of flip chip bonding of the device. In addition, the manufacturing process is mostly custom made.

In order to overcome the drawbacks in prior art, a micro tactility-simulating sensing device and a method for producing the device are disclosed.

SUMMARY OF THE INVENTION

The present invention can effectively solve the above-mentioned problems of prior art, and provide a sufficiently robust micro tactility-simulating sensing device. A chip-grade method is utilized to implement an inductive tactility-simulating sensing device, without any suspended movable element. The production of the chip uses a standard integrated circuit process, which effectively microminiaturizes the size of the sensing device to the millimeter scale. Moreover, the production of an inductive coil using standard integrated circuit process platform downsizes the sensing coil to within 1 mm, which allows the sensing device to be easily integrated into a system, e.g., a smart device. If the sensing device is used in an array, better spatial resolution can also be achieved. The inductive coil produced using the standard integrated circuit process platform has the advantage of a smaller line width, which can have more turns of the coil for the same area, and thus the inductance of the coil can be increased to enhance the signal. Through the multi-layer stacking characteristics of standard integrated circuit processes, monolithic vertical integration can be achieved for two equal-sized coils. Under the dual-coil measurement architecture, due to the fact that the sizes of the two coils are equal and the distance between them is very close (less than 1 μm), the coupling coefficient between them is high, and thus the final measurement signal read is effectively increased. Therefore, besides the inductive (single-coil) measurement method, another electromagnetic induction (dual-coil) measurement method can also be realized using the same chip. Thus, the micro tactility-simulating sensing device of the present invention can provide two different signal reading methods. Furthermore, the present invention allows the utilization of polymer molding technology, which integrates the sensing interface and the chip. In addition, the tactile load, e.g., force, can be sensed without any suspended structure. Under the same polymer thickness, only the size of the magnetic sensing interface has to be changed to measure different force ranges, while various sizes of the magnetic sensing interface can be easily produced using the commercial laser cutting technology. Therefore, the same chip and the same polymer thickness can be used to easily produce the micro tactility-simulating sensing devices measuring different force ranges. Further, the sensing chip can be produced by the commercial manufacturing process, and thus has a higher process yield and reliability. The sensing chip does not need a special custom made manufacturing process, and thus has the potential for commercial mass production. Accordingly, the present invention has utility in the industry and significant practical applications.

In accordance with one aspect of the present invention, a micro tactility-simulating sensing device is disclosed. The micro tactility-simulating sensing device includes: a chip including a first top surface and a first inductor, wherein the first top surface has wiring through holes configured to allow an external circuit to connect to the first inductor, and the first top surface is a flat surface except the wiring through holes; a magnetic rigid body coupled with the first inductor to allow the first inductor to sense a magnetic flux passing therethrough, and configured to receive a tactile load; and a polymer configured between the chip and the magnetic rigid body to have a characteristic distance therebetween, wherein the characteristic distance and the magnetic flux have a functional relationship.

In accordance with a further aspect of the present invention, a micro tactility-simulating sensing device is disclosed. The micro tactility-simulating sensing device includes: a chip having a first top surface and a first inductor, wherein the first top surface is a flat surface; a magnetic rigid body coupled with the first inductor to allow the first inductor to sense a magnetic flux passing therethrough, and configured to receive a tactile load; and a polymer disposed between the chip and the magnetic rigid body to have a characteristic distance therebetween, wherein the characteristic distance and the magnetic flux have a functional relationship.

In accordance with another aspect of the present invention, a method for producing a micro tactility-simulating sensing device is disclosed. The method for producing a micro tactility-simulating sensing device includes the following steps: providing a chip having a first top surface and a first inductor, wherein: when the first top surface has wiring through holes configured to allow an external circuit to connect to the first inductor, the first top surface is a flat surface except the wiring through holes; and when the first top surface is free from any wiring through hole, the first top surface is a flat surface; providing a bonding wire having a first end; connecting the first inductor to the first end of the bonding wire; using a polymer to encapsulate the chip; providing a magnetic rigid body; and disposing the magnetic rigid body on the polymer, wherein the magnetic rigid body is coupled with the first inductor to allow the first inductor to sense a magnetic flux passing therethrough, the polymer has a characteristic distance between the chip and the magnetic rigid body, and the characteristic distance and the magnetic flux have a functional relationship.

BRIEF DESCRIPTION OF THE DRAWINGS

The details and advantages of the present invention will become more readily apparent to those ordinarily skilled in the art after reviewing the following detailed descriptions and accompanying drawings.

DETAILED DESCRIPTION OF THE PREFERRED EMBODIMENT

The present invention will now be described more specifically with reference to the following embodiments. It is to be noted that the following descriptions of the preferred embodiments of this invention are presented herein for the purposes of illustration and description only; they are not intended to be exhaustive or to be limited to the precise form disclosed.

Figure 1:
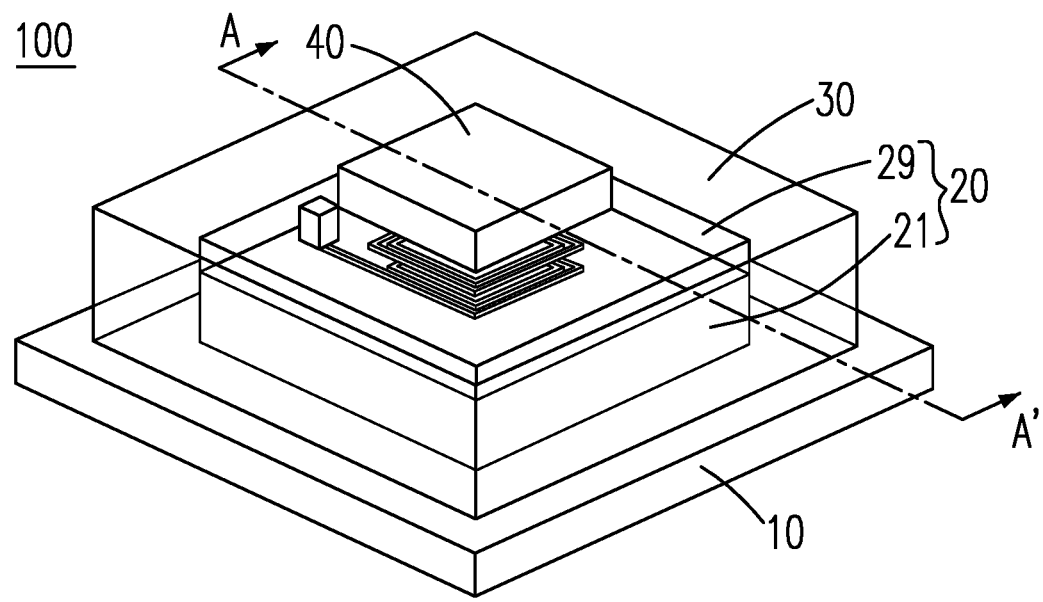
FIG. 1 is a perspective schematic diagram of a micro tactility-simulating sensing device in an embodiment of the present invention.
Figure 2:
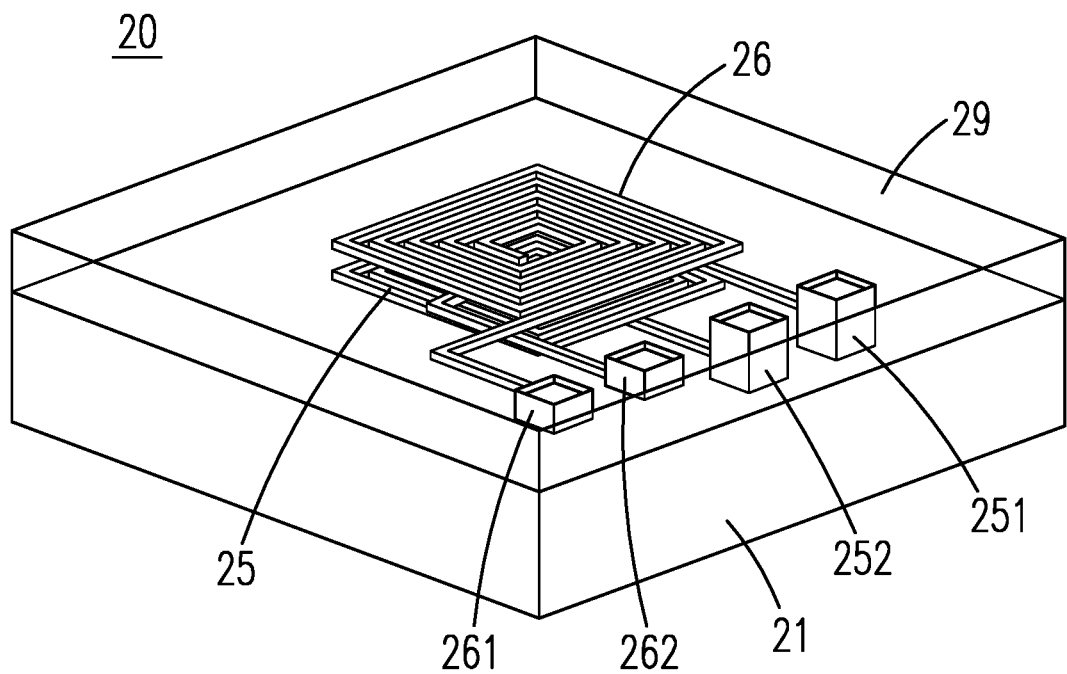
FIG. 2 is a perspective schematic diagram of the chip including two inductive coils shown in FIG. 1 observed from a different direction.
Figure 3:
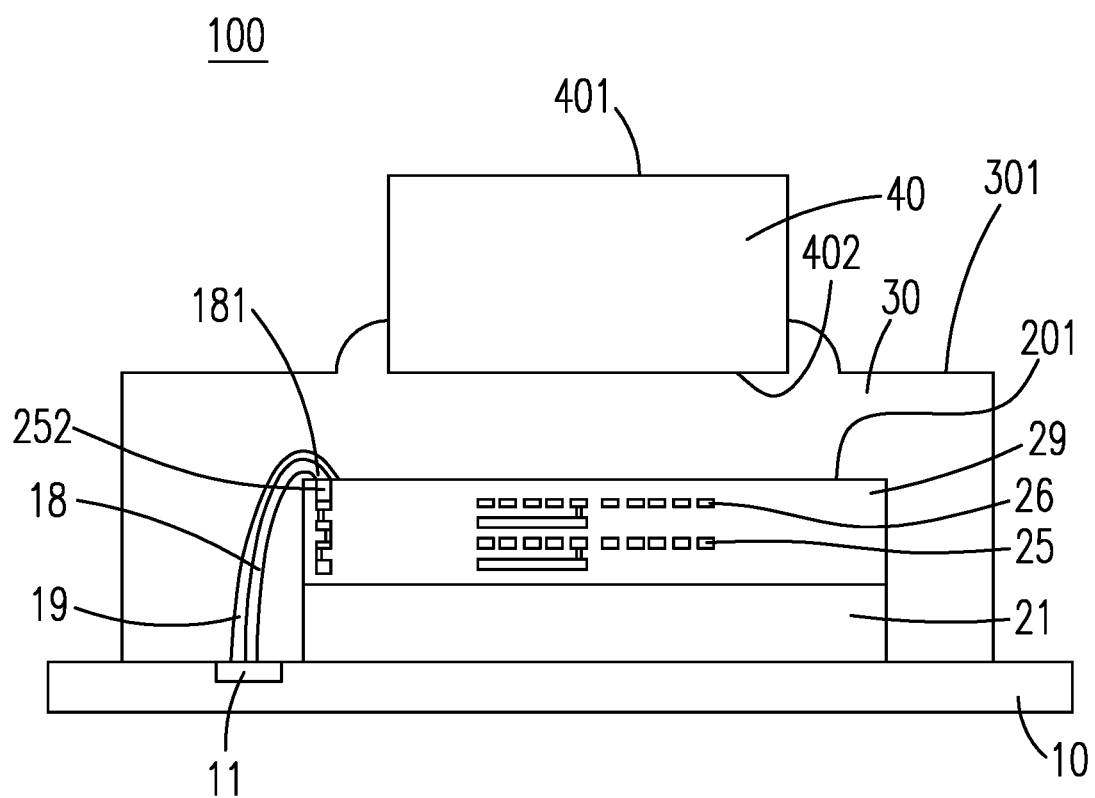
FIG. 3 is a sectional schematic diagram of a cut view of the micro tactility-simulating sensing device along the section line A-A' in FIG. 1.

Please refer to FIGS. 1-3. The micro tactility-simulating sensing device 100 of the present invention can be installed on a carrier 10. For tests in the laboratory, a printed circuit board (PCB) can be used as the carrier 10, and the external circuit for signal measurement can be configured on the PCB. In many embodiments for other applications, different carriers 10 can be used, or carrier 10 is not used. The micro tactility-simulating sensing device 100 of the present invention includes a chip 20, a polymer 30 and a magnetic rigid body 40. The chip 20 consists of a substrate 21 and a chip circuit 29. In the standard integrated circuit process, the integrated circuits are fabricated on a semiconductor wafer, then the wafer with integrated circuits are cut into chips. The substrate 21 is the part of the semiconductor wafer remained in the chip after the cut, and the chip circuit 29 is the part fabricated in the integrated circuit process. The chip circuit 29 includes the first inductor 25 and the second inductor 26 which are vertically stacked in the chip 20. Typical size of the chip is 1.7 mm×1.7 mm. The top surface of the chip 20 is called the first top surface 201 in the present application. The polymer 30 is used for encapsulating the chip 20 and providing elasticity. In an embodiment, the polymer 30 is a silicone elastomer. In the embodiment shown in FIG. 1, the magnetic rigid body 40 used as the sensing interface is a cuboid, and one part of the magnetic rigid body 40 is embedded in the polymer 30 with the other part exposed above the surface 301 of the polymer 30. The magnetic rigid body 40 can also be a non-cuboid. In general, if the magnetic rigid body 40 is a bulk material, then commercial laser cutting technology can be utilized to obtain the shape and size needed. Besides, the top surface of the magnetic rigid body 40 is called the second top surface 401 in the present application. The second top surface 401 is configured to receive the tactile load. In the embodiment, the bottom surface 402 of the magnetic rigid body 40 is a plane facing toward the first top surface 201, but the bottom surface 402 and the first top surface 201 are separated by the polymer 30. In the present invention, the shape of the magnetic rigid body 40 is chosen to have better adhesion with the polymer 30. For example, the bottom surface 402 of the magnetic rigid body 40 is a plane. Furthermore, the shape of the magnetic rigid body 40 also has to match the first inductor 25 and the second inductor 26 to obtain a better measured signal. For example, when both the first inductor 25 and the second inductor 26 are square coils, the magnetic rigid body 40 can be chosen to be a cuboid whose projection is also a square. It is also possible that the second top surface 401 of the magnetic rigid body 40 is not exposed above the surface 301 of the polymer 30. The magnetic rigid body 40 is coupled with the first inductor 25 and the second inductor 26, to allow the first inductor 25 and the second inductor 26 to sense the magnetic flux passing therethrough. In addition, FIG. 1 also shows the position of the section line A-A'.

FIG. 2 is a perspective schematic diagram of the chip 20 of FIG. 1 observed from a different direction. The chip circuit 29 includes the first inductor 25 and the second inductor 26 which are vertically stacked in the chip 20. In the embodiment shown in FIG. 2, both the first inductor 25 and the second inductor 26 are coils, but the number of turns of the coils in FIG. 2 is drawn only for schematic reasons. As an example of standard integrated circuit processes, the complementary metal-oxide-semiconductor (CMOS) processes of Taiwan Semiconductor Manufacturing Company (TSMC) provide at least 4 stacking layers, with insulation layers separating adjacent stacking layers. Take the 2P4M CMOS process of TSMC as an example, 4 metal layers are provided. They are, from top to bottom, M4, M3, M2 and M1 layers. The second inductor 26 located at a higher position in FIG. 2 can be configured in the M4 layer. The end of the outmost turn of the coil of the second inductor 26 connects from the same layer (M4 layer) to the opening of the wiring through hole 261 on the first top surface 201 of the chip 20. The end of the innermost turn of the coil of the second inductor 26 connects, through the through holes connecting the M4 layer and the M3 layer, from the M3 layer to the opening of the wiring through hole 262 on the first top surface 201 of the chip 20. There are usually a plural number of through holes connecting the M4 layer and the M3 layer under the end of the innermost turn of the coil of the second inductor 26, and the plural number of through holes connecting the M4 layer and the M3 layer are usually all used for connecting to the wiring through hole 262 to lower the resistance. Similarly, the first inductor 25 can be configured in the M2 layer. The end of the outmost turn of the coil of the first inductor 25 connects from the same layer (M2 layer) to the opening of the wiring through hole 251 on the first top surface 201 of the chip 20. The end of the innermost turn of the coil of the first inductor 25 connects, through the through holes connecting the M2 layer and the M1 layer, from the M1 layer to the opening of the wiring through hole 252 on the first top surface 201 of the chip 20.

Therefore, there is a distance between the first inductor 25 and the second inductor 26, but the distance is very small (less than 1 μm). The coupling coefficient between the first inductor 25 and the second inductor 26 is thus high, which effectively increasing the magnitude of the final measurement signal read. The wiring through holes 251, 252, 261 and 262 allow the external circuit for signal measurement to connect to the first inductor 25 and the second inductor 26. The first top surface 201 of the chip 20 is a flat surface except the wiring through holes 251, 252, 261 and 262. When the chip is so designed that the openings of the wiring through holes 251, 252, 261 and 262 are not located on the first top surface 201 of the chip 20, the first top surface 201 is a flat surface (not shown in the figures).

FIG. 3 is a sectional schematic diagram of a cut view of the micro tactility-simulating sensing device 100 along the section line A-A' in FIG. 1. The carrier 10 under the micro tactility-simulating sensing device 100 can be seen in FIG. 3. The electrical connection point 11 on the carrier 10 of the embodiment is also shown in FIG. 3. The substrate 21 and the chip circuit 29 composing the chip 20 in the middle area on the top of the carrier 10 can also be seen in FIG. 3. The chip circuit 29 includes the first inductor 25 and the second inductor 26 which are vertically stacked in the chip 20. In the embodiment, both the first inductor 25 and the second inductor 26 are coils. FIG. 3 shows ten cross sections of each inductor coil, but of course the numbers of turns of the coils in FIG. 3 are drawn only for schematic reasons. The first inductor 25 and the second inductor 26 are connected to the external circuit (not shown in the figure) for signal measurement through the wiring through holes 251, 252, 261 and 262 (only the wiring through hole 252 is shown in FIG. 3), the bonding wire 18 and the electrical connection point 11 on the carrier 10. The bonding wire 18 is covered with the wire protection material 19. In an embodiment, the wire protection material 19 is epoxy. FIG. 3 also shows the first top surface 201 of the chip 20, the polymer 30 and the magnetic rigid body 40.

In producing the micro tactility-simulating sensing device 100, the chip 20 can be provided by a commercial manufacturing process. The chip 20 with the wiring through holes 251, 252, 261 and 262 located or not located on the first top surface 201 is thus obtained. After the chip 20 is obtained, one ends of plural bonding wires 18, called the first ends 181 (as shown in FIG. 3), are respectively connected with the ends of the outmost and innermost turns of the coils of the first inductor 25 and the second inductor 26 through the wiring through holes 251, 252, 261 and 262. The bonding wires 18 are then covered with the wire protection material 19. Afterwards the chip 20 is encapsulated using the polymer 30, and then the magnetic rigid body 40 is embedded in the polymer 30. The magnetic rigid body 40 is located over the chip 20. In an embodiment, the chip is first encapsulated by a first polymer using polymer molding technology. After the curing of the first polymer, the magnetic rigid body is integrated by a second polymer, and then the sensing device of the present invention is ejected. The first polymer and the second polymer can be the same or different.

Figure 4:
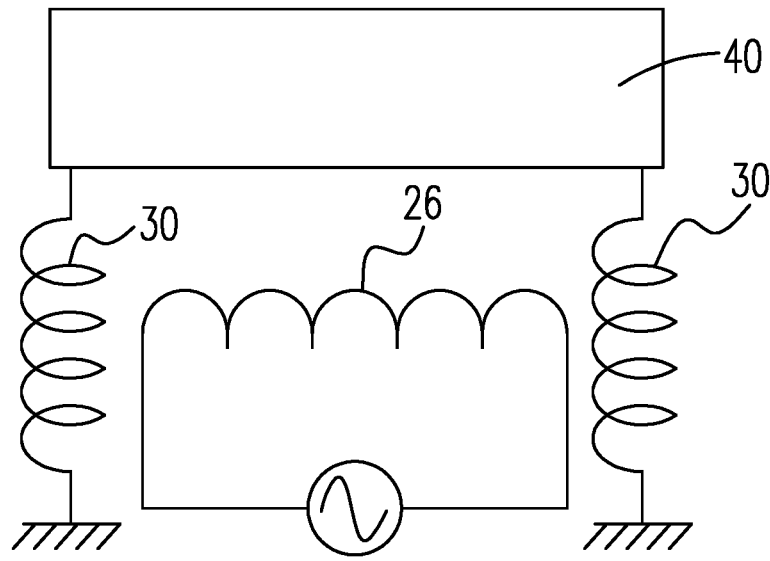
FIG. 4 is an equivalent model for an embodiment of the present invention using single inductive coil for measurement.
Figure 5:
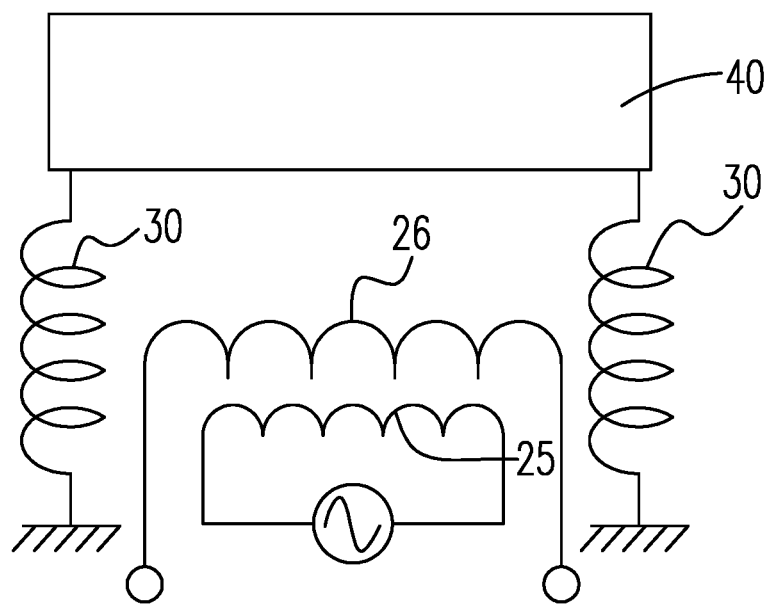
FIG. 5 is an equivalent model for an embodiment of the present invention using dual inductive coils for measurement.

Please refer to FIGS. 4-5, which are respectively equivalent models for an embodiment of the present invention using single inductive coil and dual inductive coils for measurement. In the equivalent models the polymer 30 corresponds to mechanical springs. Therefore, it can be stated that the polymer 30 between the chip 20 and the magnetic rigid body 40 has a characteristic distance. The characteristic distance varies with the tactile load, wherein the characteristic distance and the magnetic flux passing through the first inductor 25 and the second inductor 26 have a functional relationship. The tactile load is measured through the functional relationship. When measuring the tactile load, the signal reading can be distinguished into two modes. The two modes are single-coil signal pickup (as shown in FIG. 4), i.e., reading the inductance signal with the first inductor 25 or the second inductor 26 (only the second inductor 26 is shown in FIG. 4), and dual-coil signal pickup (as shown in FIG. 5), i.e., one of the first inductor 25 and the second inductor 26 being used for inputting the driving signal, and the other one of the first inductor 25 and the second inductor 26 being used for reading a sensing voltage signal. In the single-coil signal pickup, the alternating current (AC) driving signal is inputted and the first inductor 25 or the second inductor 26 has its own lines of magnetic force. When the tactile load makes the polymer 30 deform, i.e., the characteristic distance changes, the lines of magnetic force are affected, causing inductance change, which in turn allows the tactile load to be obtained. In the dual-coil signal pickup, AC driving signal is inputted to the first inductor 25, and the second inductor 26 generates corresponding AC signal, i.e., the sensing signal, according to Faraday's law and outputs voltage. When the tactile load makes the polymer 30 deform, i.e., the characteristic distance changes, the induced electromotive force changes, causing the change of sensing signal, which in turn allows the tactile load to be obtained.

Figure 6:
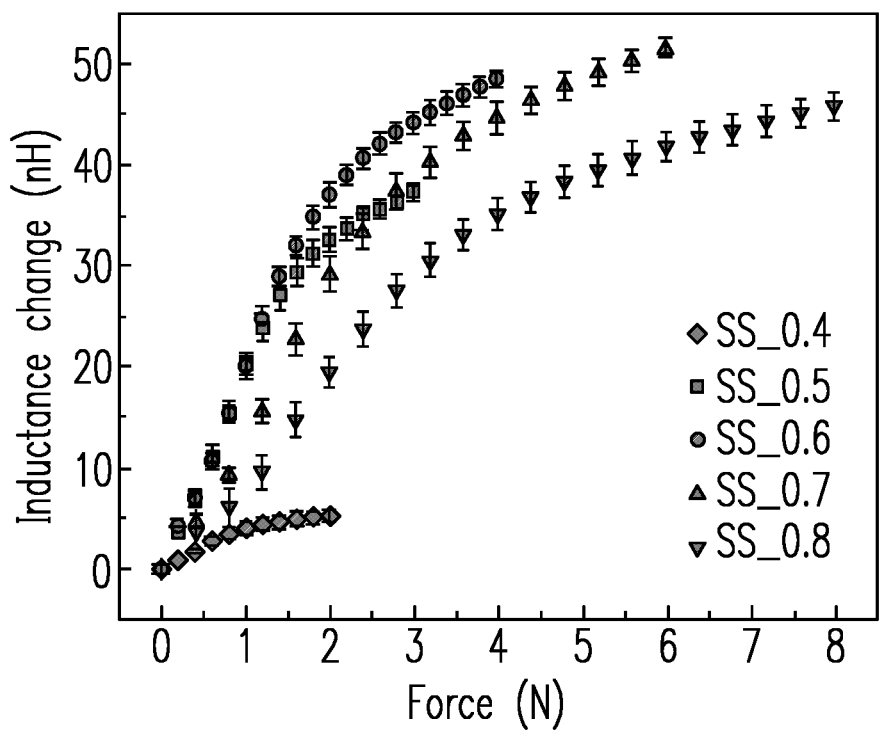
FIG. 6 is the measurement result of an embodiment of the present invention using single inductive coil for measurement.

FIG. 6 is the inductance change as a function of force for an embodiment of the present invention using single inductive coil for measurement. In the embodiment corresponding to FIG. 6, the material of the magnetic rigid body 40 is stainless steel (SS), and the shape of the magnetic rigid body 40 is a cuboid whose projection is a square. SS_0.4 in FIG. 6 represents stainless steel with the square having a 0.4 mm side length, and so on for the rest. The fact that the areas of the corresponding squares for different cuboids are different means that the sizes of the sensing interfaces for the force are different, resulting in the measured inductance changes being different. The slope in FIG. 6 represents sensitivity. When the sizes of the sensing interfaces for the force are different, the slopes are different and the turning points of slopes are also different. Therefore, measurable force ranges are different. That is to say, with the same inductive coils and the same polymer, different sensing sensitivities and force ranges can be obtained only by changing the size of the sensing interface.

Figure 7:
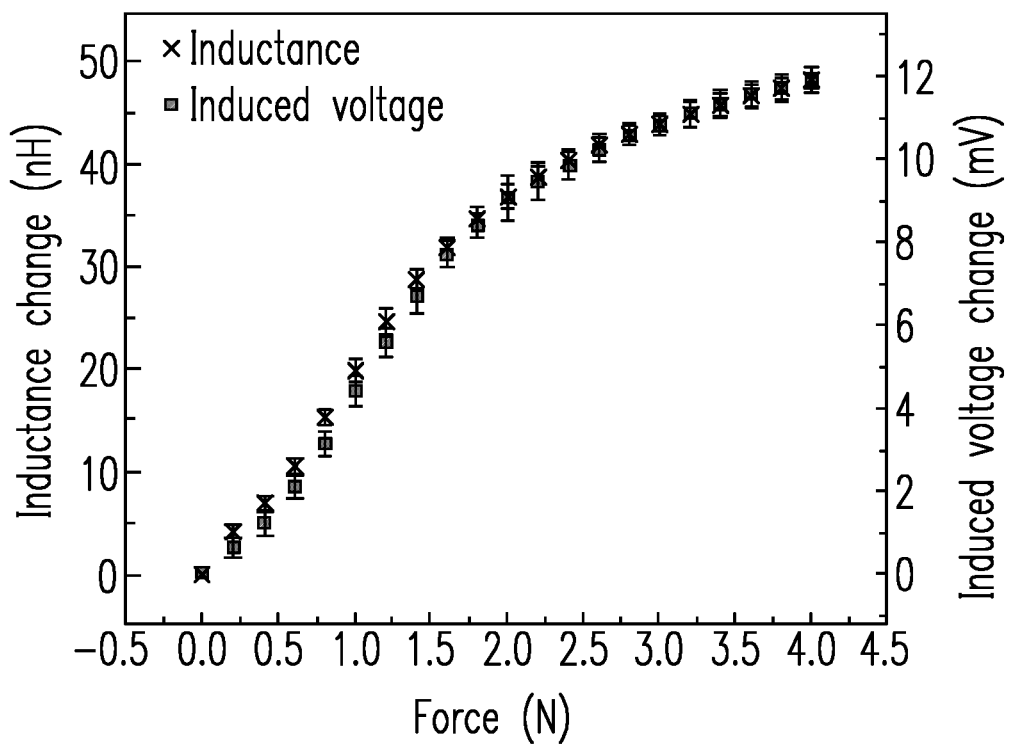
FIG. 7 is a comparison graph of the measurement results of an embodiment of the present invention using dual inductive coils and single inductive coil for measurement.

FIG. 7 plots the induced voltage change as a function of force using dual inductive coils for measurement and the inductance change as a function of force using single inductive coil for measurement in the same graph to compare the trends. SS_0.6 magnetic rigid body is used for both. In FIG. 7, it can be seen that the trends for the single inductive coil or the dual inductive coils are the same. Therefore, the micro tactility-simulating sensing device of the present invention can provide two different signal reading methods, which allows the designer (user) to freely choose the way of the signal output. Usually the designer is limited by the manufacturing ability of the foundry, but the present invention offers the designer different choices.

EMBODIMENTS

1. A micro tactility-simulating sensing device, including: a chip including a first top surface and a first inductor, wherein the first top surface has wiring through holes configured to allow an external circuit to connect to the first inductor, and the first top surface is a flat surface except the wiring through holes; a magnetic rigid body coupled with the first inductor to allow the first inductor to sense a magnetic flux passing therethrough, and configured to receive a tactile load; and a polymer configured between the chip and the magnetic rigid body to have a characteristic distance therebetween, wherein the characteristic distance and the magnetic flux have a functional relationship.

2. The sensing device according to Embodiment 1, wherein the characteristic distance varies with the tactile load, the magnetic rigid body has a second top surface and a bottom surface, the second top surface is configured to receive the tactile load, and the bottom surface is a plane facing toward the first top surface.

3. The sensing device according to Embodiment 1 or 2, wherein the magnetic rigid body is a cuboid.

4. The sensing device according to any one of Embodiments 1-3, wherein the chip has a second inductor, and the first and the second inductors are vertically stacked in the chip and have a distance therebetween.

5. The sensing device according to Embodiment 4, wherein one of the first inductor and the second inductor reads an inductance signal.

6. The sensing device according to Embodiment 4 or 5, wherein one of the first inductor and the second inductor inputs therefrom a driving signal, and the other one of the first inductor and the second inductor reads a sensing voltage signal.

7. The sensing device according to any one of Embodiments 4-6, wherein the distance is less than 1 µm.

8. A micro tactility-simulating sensing device, including: a chip having a first top surface and a first inductor, wherein the first top surface is a flat surface; a magnetic rigid body coupled with the first inductor to allow the first inductor to sense a magnetic flux passing therethrough, and configured to receive a tactile load; and a polymer disposed between the chip and the magnetic rigid body to have a characteristic distance therebetween, wherein the characteristic distance and the magnetic flux have a functional relationship.

9. The sensing device according to Embodiment 8, wherein the characteristic distance varies with the tactile load, the magnetic rigid body has a second top surface and a bottom surface, the second top surface is configured to receive the tactile load, and the bottom surface is a plane facing toward the first top surface.

10. The sensing device according to Embodiment 8 or 9, wherein the magnetic rigid body is a cuboid.

11. The sensing device according to any one of Embodiments 8-10, wherein the chip has a second inductor, and the first inductor and the second inductor vertically stacked in the chip and have a distance therebetween.

12. The sensing device according to Embodiment 11, wherein one of the first inductor and the second inductor reads an inductance signal.

13. The sensing device according to Embodiment 11 or 12, wherein one of the first inductor and the second inductor inputs therefrom a driving signal, and the other one of the first inductor and the second inductor reads a sensing voltage signal.

14. The sensing device any one of Embodiments 11-13, wherein the distance is less than 1 µm.

15. A method for producing a micro tactility-simulating sensing device, including the following steps: providing a chip having a first top surface and a first inductor, wherein: when the first top surface has wiring through holes configured to allow an external circuit to connect to the first inductor, the first top surface is a flat surface except the wiring through holes; and when the first top surface is free from any wiring through hole, the first top surface is a flat surface; providing a bonding wire having a first end; connecting the first inductor to the first end of the bonding wire; using a polymer to encapsulate the chip; providing a magnetic rigid body; and disposing the magnetic rigid body on the polymer, wherein the magnetic rigid body is coupled with the first inductor to allow the first inductor to sense a magnetic flux passing therethrough, the polymer has a characteristic distance between the chip and the magnetic rigid body, and the characteristic distance and the magnetic flux have a functional relationship.

16. The method according to Embodiment 15, wherein the magnetic rigid body has a second top surface to receive a tactile load.

17. The method according to Embodiment 15 or 16, wherein the characteristic distance varies with the tactile load.

18. The method according to any one of Embodiments 15-17, wherein the chip includes a second inductor, the first and the second inductors are vertically stacked in the chip, and there is a distance between the first inductor and the second inductor.

19. The method according to Embodiment 18, wherein one of the first inductor and the second inductor reads an inductance signal.

20. The method according to Embodiment 18 or 19, wherein one of the first inductor and the second inductor inputs therefrom a driving signal, and the other one of the first inductor and the second inductor reads a sensing voltage signal.

It is contemplated that modifications and combinations will readily occur to those skilled in the art, and these modifications and combinations are within the scope of this invention.

What is claimed is:

1. A micro tactility-simulating sensing device, comprising:
   a chip including a first top surface and a first inductor, wherein the first top surface has wiring through holes configured to allow an external circuit to connect to the first inductor, and the first top surface is a flat surface except the wiring through holes;
   a magnetic rigid body coupled with the first inductor to allow the first inductor to sense a magnetic flux passing therethrough, and configured to receive a tactile load; and
   a polymer configured between the chip and the magnetic rigid body to have a characteristic distance therebetween, wherein the characteristic distance and the magnetic flux have a functional relationship.

2. The sensing device as claimed in claim 1, wherein the characteristic distance varies with the tactile load, the magnetic rigid body has a second top surface and a bottom surface, the second top surface is configured to receive the tactile load, and the bottom surface is a plane facing toward the first top surface.

3. The sensing device as claimed in claim 1, wherein the magnetic rigid body is a cuboid.

4. The sensing device as claimed in claim 1, wherein the chip has a second inductor, and the first and the second inductors are vertically stacked in the chip and have a distance therebetween.

5. The sensing device as claimed in claim 4, wherein one of the first inductor and the second inductor reads an inductance signal.

6. The sensing device as claimed in claim 4, wherein one of the first inductor and the second inductor inputs therefrom a driving signal, and the other one of the first inductor and the second inductor reads a sensing voltage signal.

7. The sensing device as claimed in claim 4, wherein the distance is less than 1 µm.

8. The sensing device as claimed in claim 1, wherein the magnetic rigid body is completely embedded in the polymer without being exposed.

9. A micro tactility-simulating sensing device, comprising:
- a chip having a first top surface and a first inductor, wherein the first top surface is a flat surface;
- a magnetic rigid body coupled with the first inductor to allow the first inductor to sense a magnetic flux passing therethrough, and configured to receive a tactile load; and
- a polymer disposed between the chip and the magnetic rigid body to have a characteristic distance therebetween, wherein the characteristic distance and the magnetic flux have a functional relationship.

10. The sensing device as claimed in claim 9, wherein the characteristic distance varies with the tactile load, the magnetic rigid body has a second top surface and a bottom surface, the second top surface is configured to receive the tactile load, and the bottom surface is a plane facing toward the first top surface.

11. The sensing device as claimed in claim 9, wherein the magnetic rigid body is a cuboid.

12. The sensing device as claimed in claim 9, wherein the chip has a second inductor, and the first inductor and the second inductor vertically stacked in the chip and have a distance therebetween.

13. The sensing device as claimed in claim 12, wherein one of the first inductor and the second inductor reads an inductance signal.

14. The sensing device as claimed in claim 12, wherein one of the first inductor and the second inductor inputs therefrom a driving signal, and the other one of the first inductor and the second inductor reads a sensing voltage signal.

15. The sensing device as claimed in claim 12, wherein the distance is less than 1 µm.

16. The sensing device as claimed in claim 9, wherein the magnetic rigid body is completely embedded in the polymer without being exposed.

17. A method for producing a micro tactility-simulating sensing device, comprising the following steps:
- providing a chip having a first top surface and a first inductor, wherein:
  - when the first top surface has wiring through holes configured to allow an external circuit to connect to the first inductor, the first top surface is a flat surface except the wiring through holes; and
  - when the first top surface is free from any wiring through hole, the first top surface is a flat surface;
- providing a bonding wire having a first end;
- connecting the first inductor to the first end of the bonding wire;
- using a polymer to encapsulate the chip;
- providing a magnetic rigid body; and
- disposing the magnetic rigid body on the polymer, wherein the magnetic rigid body is coupled with the first inductor to allow the first inductor to sense a magnetic flux passing therethrough, the polymer has a characteristic distance between the chip and the magnetic rigid body, and the characteristic distance and the magnetic flux have a functional relationship.

18. The method as claimed in claim 17, wherein the magnetic rigid body has a second top surface to receive a tactile load.

19. The method as claimed in claim 18, wherein the characteristic distance varies with the tactile load.

20. The method as claimed in claim 17, wherein the chip includes a second inductor, the first and the second inductors are vertically stacked in the chip, and there is a distance between the first inductor and the second inductor.

21. The method as claimed in claim 20, wherein one of the first inductor and the second inductor reads an inductance signal.

22. The method as claimed in claim 20, wherein one of the first inductor and the second inductor inputs therefrom a driving signal, and the other one of the first inductor and the second inductor reads a sensing voltage signal.

* * * * *